(12) United States Patent
Ouyang

(10) Patent No.: US 7,417,858 B2
(45) Date of Patent: Aug. 26, 2008

(54) COOLING TECHNIQUE USING MULTIPLE MAGNET ARRAY FOR MAGNETO-HYDRODYNAMIC COOLING OF MULTIPLE INTEGRATED CIRCUITS

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 365 days.

(21) Appl. No.: 11/313,392

(22) Filed: Dec. 21, 2005

(65) Prior Publication Data

US 2007/0139879 A1 Jun. 21, 2007

(51) Int. Cl.
*H05K 7/20* (2006.01)
(52) U.S. Cl. .................. 361/699; 361/689; 361/698
(58) Field of Classification Search .......... 361/689, 361/698, 699
See application file for complete search history.

(56) References Cited

U.S. PATENT DOCUMENTS

| 4,067,237 | A | * | 1/1978 | Arcella | 73/204.23 |
| 5,144,531 | A | * | 9/1992 | Go et al. | 361/702 |
| 5,339,214 | A | * | 8/1994 | Nelson | 361/695 |
| 5,355,942 | A | | 10/1994 | Conte | |
| 5,365,749 | A | * | 11/1994 | Porter | 62/259.2 |
| 5,880,524 | A | * | 3/1999 | Xie | 257/704 |
| 5,978,220 | A | * | 11/1999 | Frey et al. | 361/699 |
| 6,766,817 | B2 | | 7/2004 | da Silva et al. | |
| 6,918,404 | B2 | | 7/2005 | Dias da Silva et al. | |
| 6,942,018 | B2 | * | 9/2005 | Goodson et al. | 165/80.4 |
| 7,066,586 | B2 | | 6/2006 | da Silva et al. | |
| 2002/0046825 | A1 | * | 4/2002 | Huang et al. | 165/80.4 |
| 2004/0234379 | A1 | * | 11/2004 | Miner et al. | 417/50 |
| 2005/0160752 | A1 | * | 7/2005 | Ghoshal et al. | 62/259.2 |

OTHER PUBLICATIONS

NN6,908,386, Electronic Equipment Cooling Using MHD Flow of Coolant, IBM Technical Disclosure Bulletin, Aug. 1, 1969, vol. 12, Issue 3, pp. 386-387.*

* cited by examiner

*Primary Examiner*—Anatoly Vortman
(74) *Attorney, Agent, or Firm*—Osha·Liang LLP

(57) ABSTRACT

A cooling apparatus uses a plurality of pipes to cool one or more integrated circuits disposed on a circuit board. The cooling apparatus uses an array of magnets to create magnetic fields across segments of the plurality of pipes. Electrical currents are induced across the magnetic fields. A flow of electrically conductive fluid in the plurality of pipes is dependent on and controllable by the magnetic fields and/or the electrical currents.

19 Claims, 9 Drawing Sheets

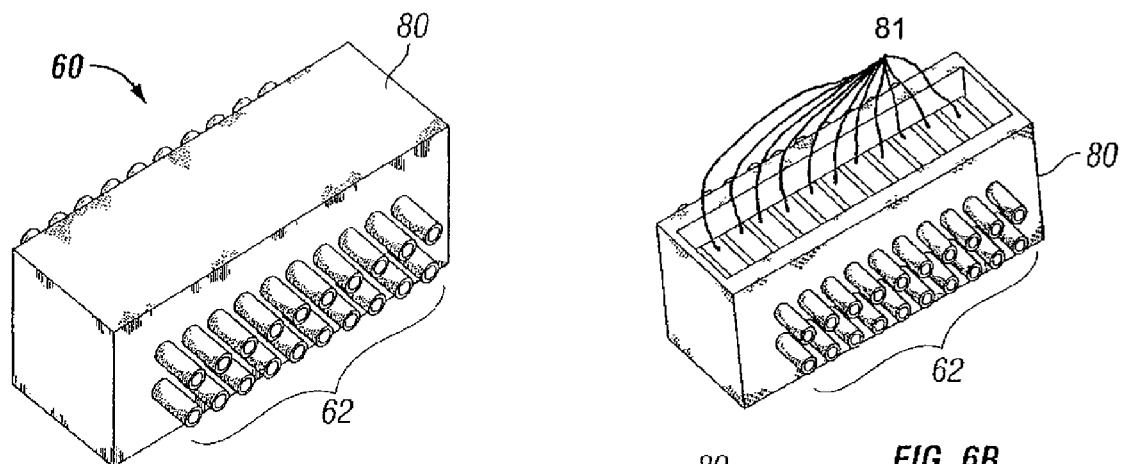
FIG. 6A
FIG. 6B
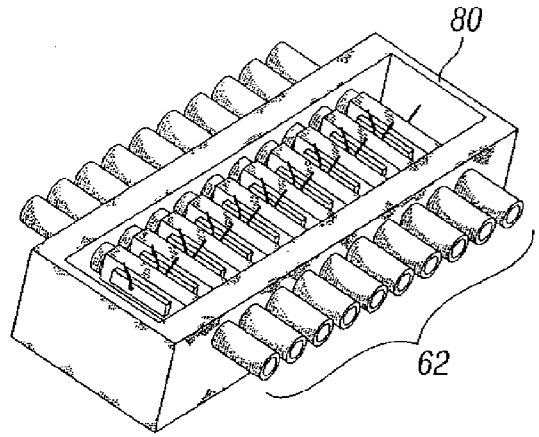
FIG. 6C
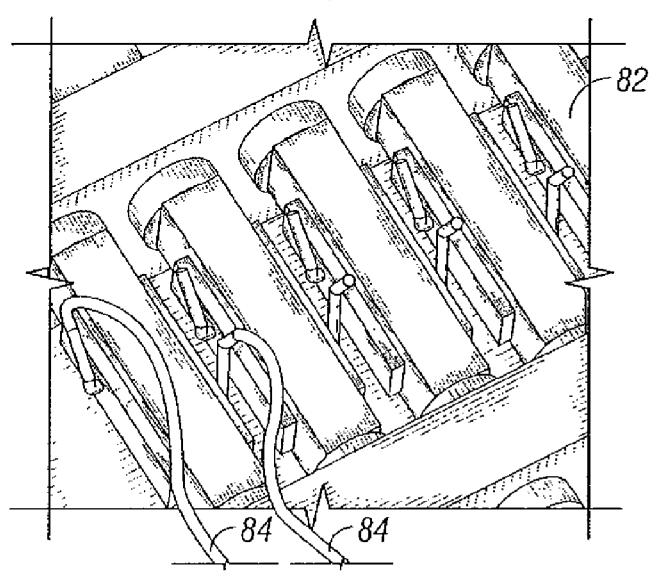
FIG. 6D

COOLING TECHNIQUE USING MULTIPLE MAGNET ARRAY FOR MAGNETO-HYDRODYNAMIC COOLING OF MULTIPLE INTEGRATED CIRCUITS

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises: a circuit board; a plurality of integrated circuits disposed on the circuit board; an array of magnets operatively disposed on the circuit board; and a plurality of pipes operatively connected between the plurality of integrated circuits and the array of magnets, where fluid flow in at least one of the plurality of pipes is dependent on at least one magnetic field generated by the array of magnets.

According to another aspect of one or more embodiments of the present invention, a method of cooling a plurality of integrated circuits comprises: generating a plurality of magnetic fields using an array of magnets; using a plurality of pipes to pass electrically and thermally conductive fluid across the plurality of magnetic fields; and propagating the fluid using the plurality of pipes toward the plurality of integrated circuits dependent on the plurality of magnetic fields.

According to another aspect of one or more embodiments of the present invention, a cooling apparatus comprises: a plurality of magnets housed in a ferromagnetic metal piece; a plurality of pipes operatively connected to the ferromagnetic metal piece, where the plurality of pipes are operatively connectable to a plurality of integrated circuits; a heat exchanger arranged to dissipate heat from fluid carried in the plurality of pipes, where flow of the fluid in the plurality of pipes is dependent on a plurality of magnetic fields generated by the plurality of magnets.

Other aspects and advantages of the invention will be apparent from the following description and the appended claims.

BRIEF DESCRIPTION OF DRAWINGS

FIG. 6A shows a portion of a cooling apparatus in accordance with an embodiment of the present invention.

FIG. 6B shows a portion of a cooling apparatus in accordance with an embodiment of the present invention.

FIG. 6C shows a portion of a cooling apparatus in accordance with an embodiment of the present invention.

FIG. 6D shows a portion of a cooling apparatus in accordance with an embodiment of the present invention.

DETAILED DESCRIPTION

Figure 1:
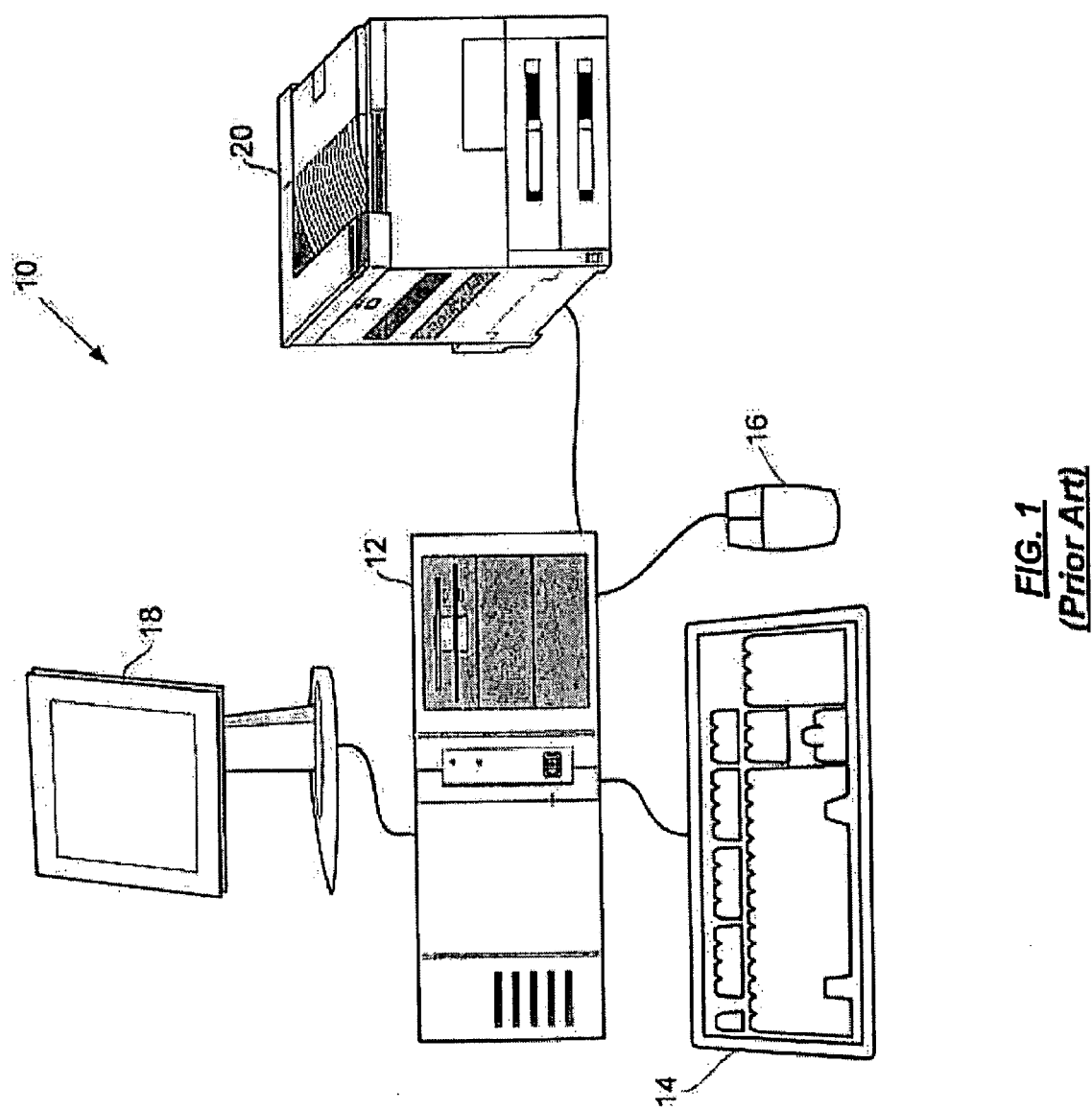
FIG. 1 shows a computer system.
Figure 2:
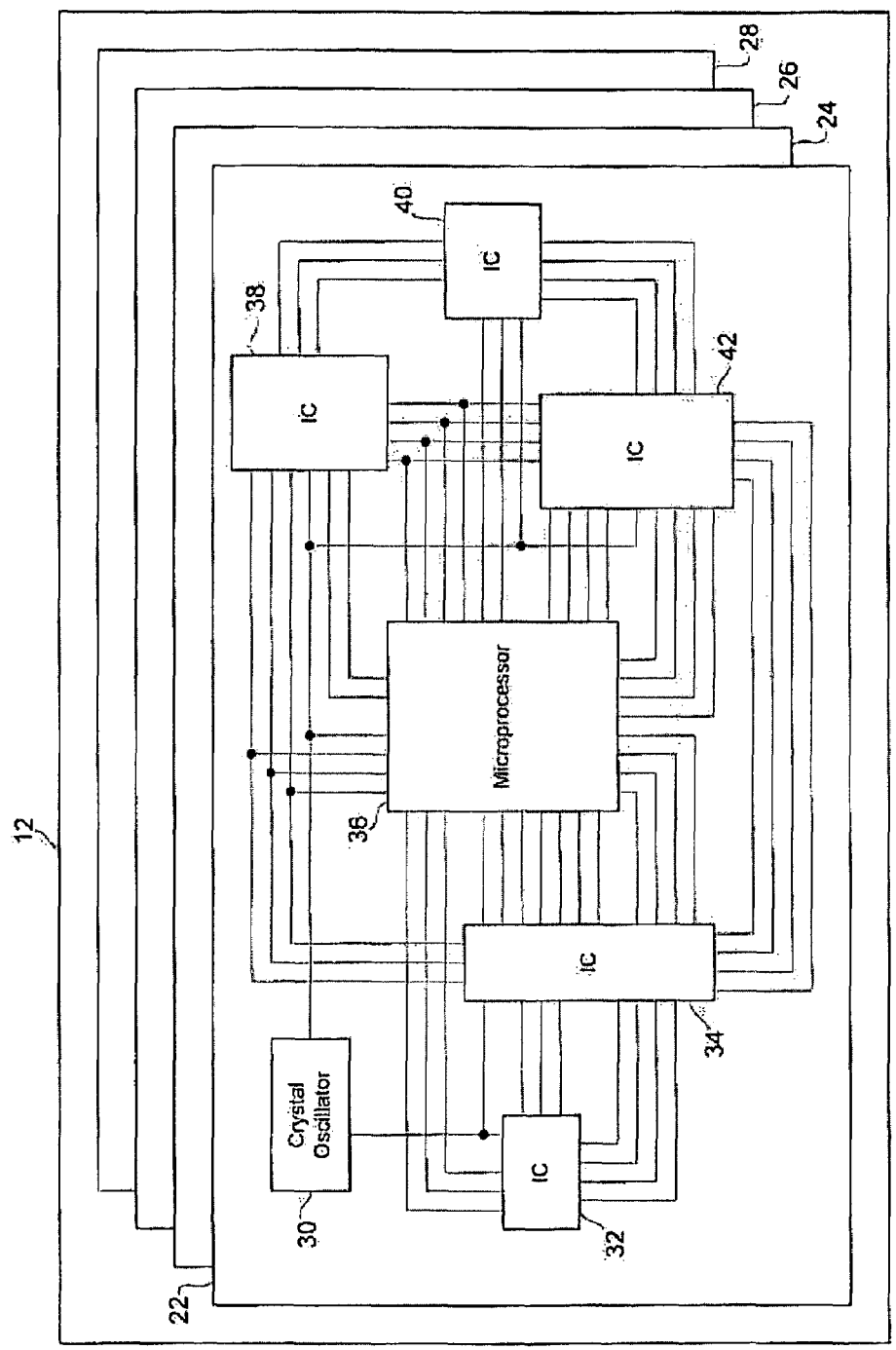
FIG. 2 shows a portion of a computer system.
Figure 3:
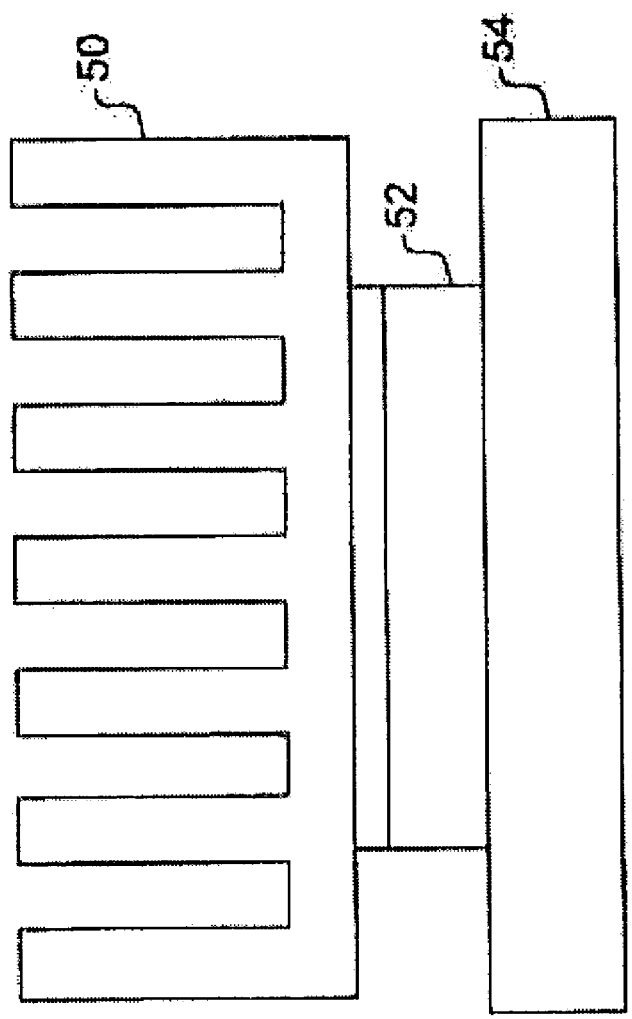
FIG. 3 shows a heat sink as used with an integrated circuit.

As described above with reference to FIG. 3, a typical heat sink is arranged to cool a singly integrated circuit. However, on a circuit board (e.g., circuit board 22 shown in FIG. 2), there are typically multiple integrated circuits. While an individual heat sink could be used for every integrated circuit that is desired to be cooled, in one or more embodiments of the present invention, a cooling apparatus uses a multiple magnet array to control fluid flow for cooling multiple integrated circuits. The multiple magnet array controls fluid flow dependent on magnetic fields generated in the multiple magnet array. Such cooling is referred to herein as "magneto-hydrodynamic" cooling.

Specific embodiments of the invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the invention. In other instances, well-known features have not been described in detail to avoid obscuring the description of embodiments of the present invention.

Figure 4A:
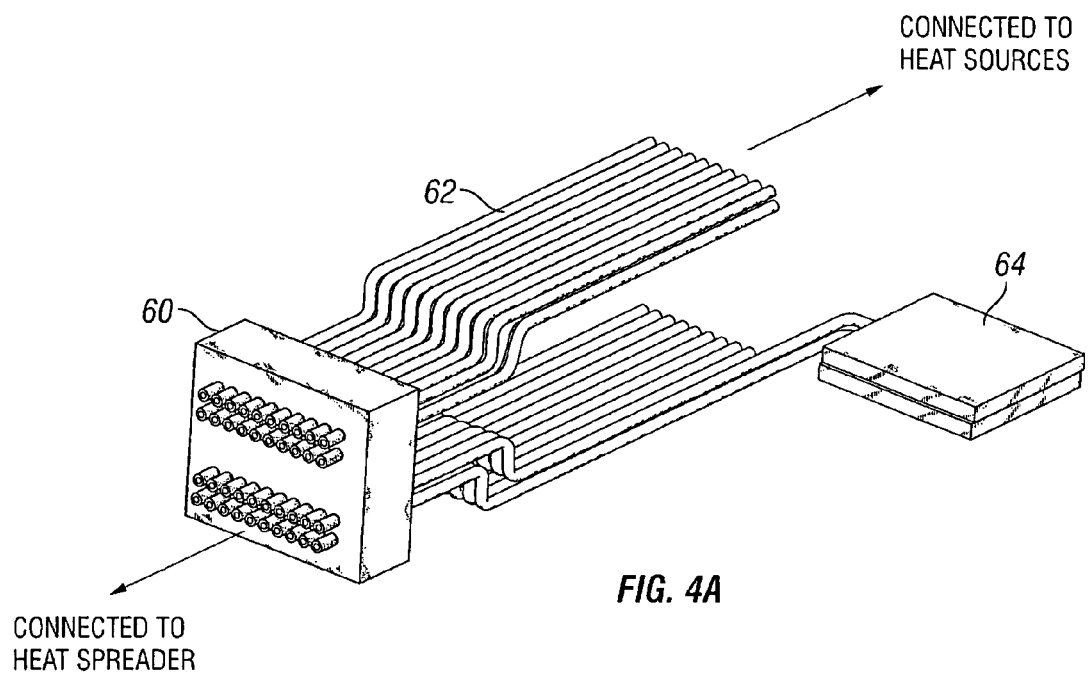
FIG. 4A shows a portion of a heat sink in accordance with an embodiments of the present invention.
Figure 4B:
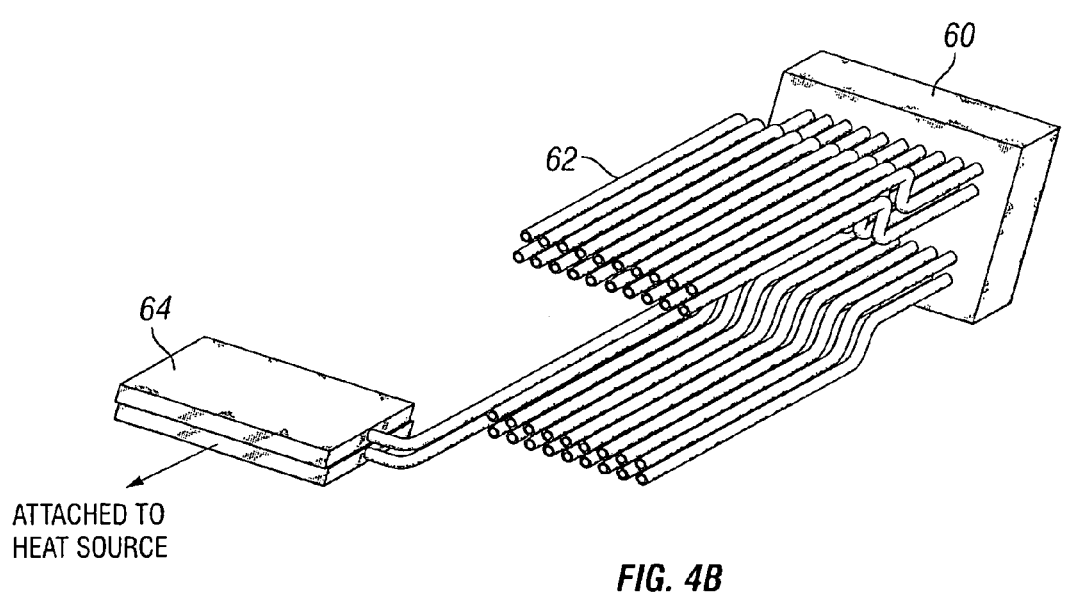
FIG. 4B shows a portion of a cooling apparatus in accordance with an embodiment of the present invention.

FIGS. 4A and 4B show portions of a cooling apparatus in accordance with one or more embodiments of the present invention. In FIG. 4A, a multiple magnet array 60 is operatively connected to several groups (or "levels") of magneto-hydrodynamic pipes 62. The multiple magnet array 60 is arranged to control the flow of fluid in the magneto-hydrodynamic pipes 62 between a heat spreader (or "heat exchanger") (e.g., a copper body having a plurality of fins to dissipate heat) (not shown) and one or more heat sources (e.g., integrated circuits).

Further, as shown in FIGS. 4A and 4B, groups of the magneto-hydrodynamic pipes 62 may be operatively connected to an enclosure member 64 that is attached to a heat source desired to be cooled. The enclosure member 64 may be arranged to at least temporarily pool fluid delivered for cooling an attached heat source. Accordingly, those skilled in the art will note that the enclosure member 64 may have a cavity for pooling fluid. In such a manner, differing volumes of fluid may be delivered to the enclosure member 64 for cooling of the attached heat source.

Figure 5:
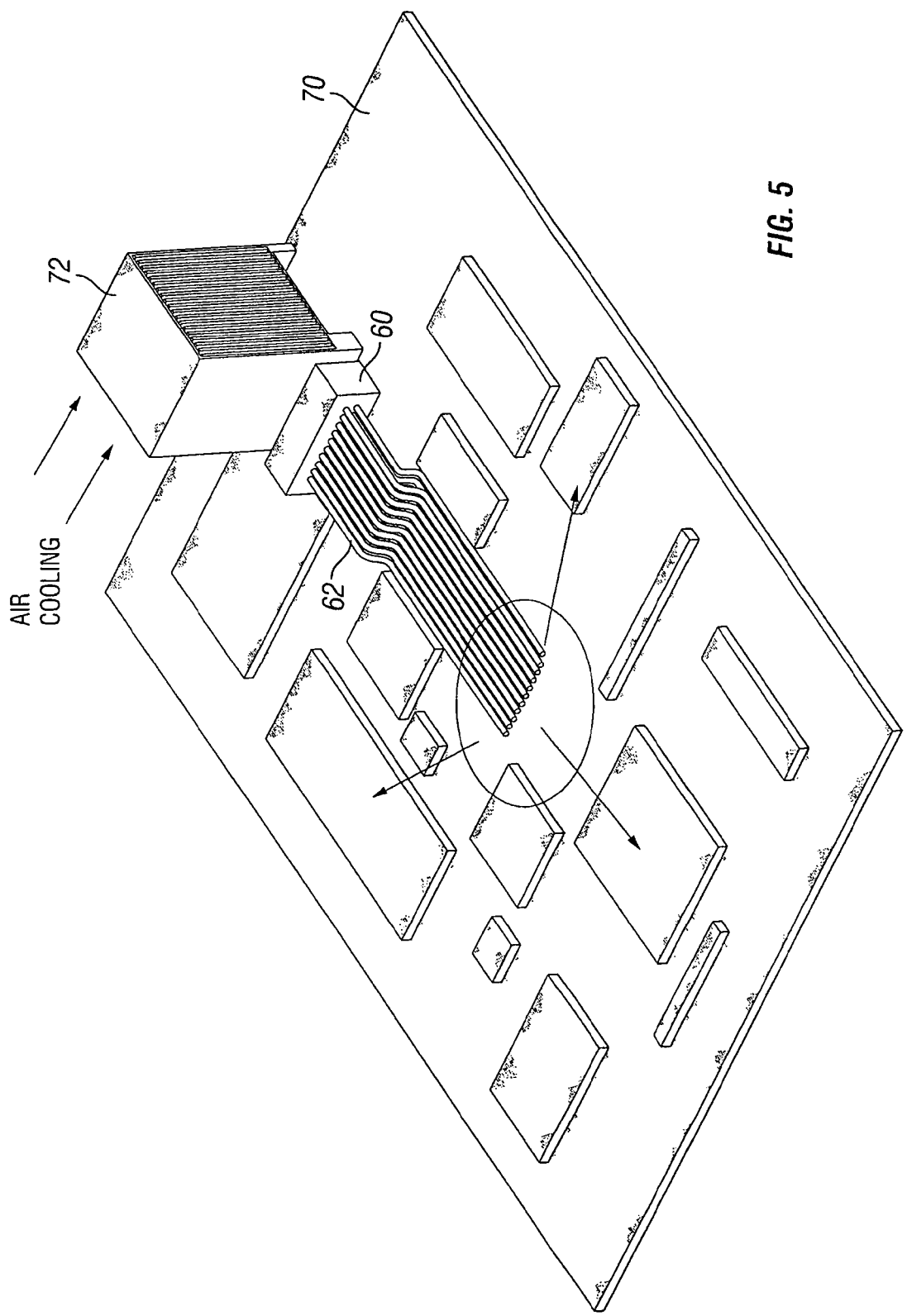
FIG. 5 shows a cooling apparatus in accordance with an embodiment of the present invention.

FIG. 5 shows an example of a cooling apparatus in accordance with an embodiment of the present invention. Particularly, FIG. 5 shows a cooling apparatus as it is implemented on a circuit board 70. The multiple magnet array 60 is operatively connected to the magneto-hydrodynamic pipes 62. The multiple magnet array 60 is also operatively connected to or attached to heat sink cooling fins 72. The heat sink cooling fins 72 are arranged to dissipate heat as air is passed through the heat sink cooling fins 72 (an example of a direction of air flow through the heat sink cooling fins 72 is indicated by the corresponding arrows shown in FIG. 5).

Fluid carried by the magneto-hydrodynamic pipes 62 may be directed to one or more integrated circuits (shown, but not labeled) disposed on the circuit board 70. Further, certain groups of the magneto-hydrodynamic pipes 62 are arranged to carry heated fluid away from one or more integrated circuits (shown, but not labeled) disposed on the circuit board 70.

FIG. 6A shows a portion of a cooling apparatus in accordance with an embodiment of the present invention. Particularly, FIG. 6A shows an example of the multiple magnet array 60. The multiple magnet array 60, as described above, is arranged to generate a plurality of magnetic fields. Accordingly, the multiple magnet array 60 may be housed in a ferromagnetic metal piece 80 arranged to at least partially shield the plurality of magnetic fields. Those skilled in the art will note that such shielding may eliminate or at least reduce magnetic interference with other components (e.g., integrated circuits).

FIGS. 6B, 6C, and 6D shows interior portions of the multiple magnet array 60. Within the ferromagnetic metal piece 80, each of the magneto-hydrodynamic pipes 62 has an electrically non-conductive segment 82. For example, in one or more embodiments of the present invention, a segment of a magneto-hydrodynamic pipe 62 within the confines of the ferromagnetic metal piece 80 may be formed of plastic. As can be clearly seen, a plurality of magnets 81 are housed in the ferromaanetic metal piece 80.

Now, as most clearly shown in FIG. 6D, a first electrical conductor (shown, but not labeled) is disposed along a portion of each of the electrically non-conductive segments 82. A second electrical conductor (shown, but not labeled) is disposed along another portion of each of the electrically non-conductive segments 82. Connected to each first electrical conductor (shown, but not labeled) and each second electrical conductor (shown, but not labeled) are wires 84. The wires 84 may be used to carry current to or apply voltage to a connected first or second electrical conductor. In one or more embodiments of the present invention, the first electrical conductors (shown, but not labeled) and the second electrical conductors (shown, but not labeled) may be formed of, for example, copper.

Figure 7:
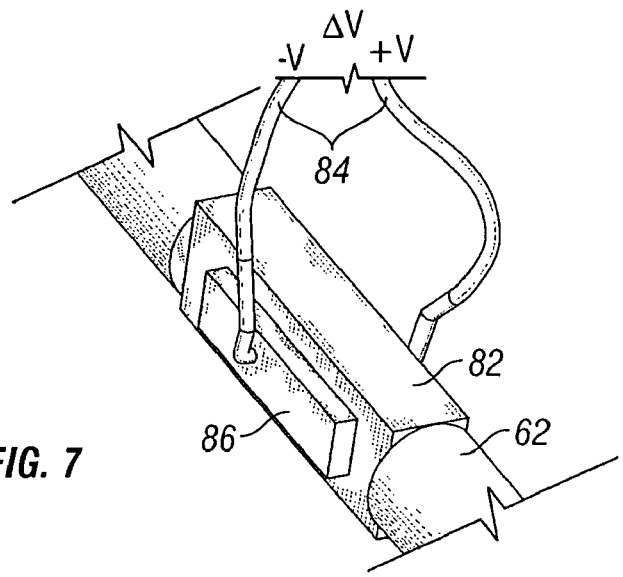
FIG. 7 shows a portion of a cooling apparatus in accordance with an embodiment of the present invention.

For purposes of clarity, FIG. 7 shows an example of an individual magneto-hydrodynamic pipe 62 and electrically non-conductive segment 82 that is housed in a multiple magnet array. In FIG. 7, a first electrical conductor 86 is attached to a portion of the electrically non-conductive segment 82. A second electrical conductor (not shown) is attached to another portion of the electrically non-conductive segment 82.

Figure 8:
FIG. 8 shows a portion of a cooling apparatus in accordance with an embodiment of the present invention.
Figure 8:
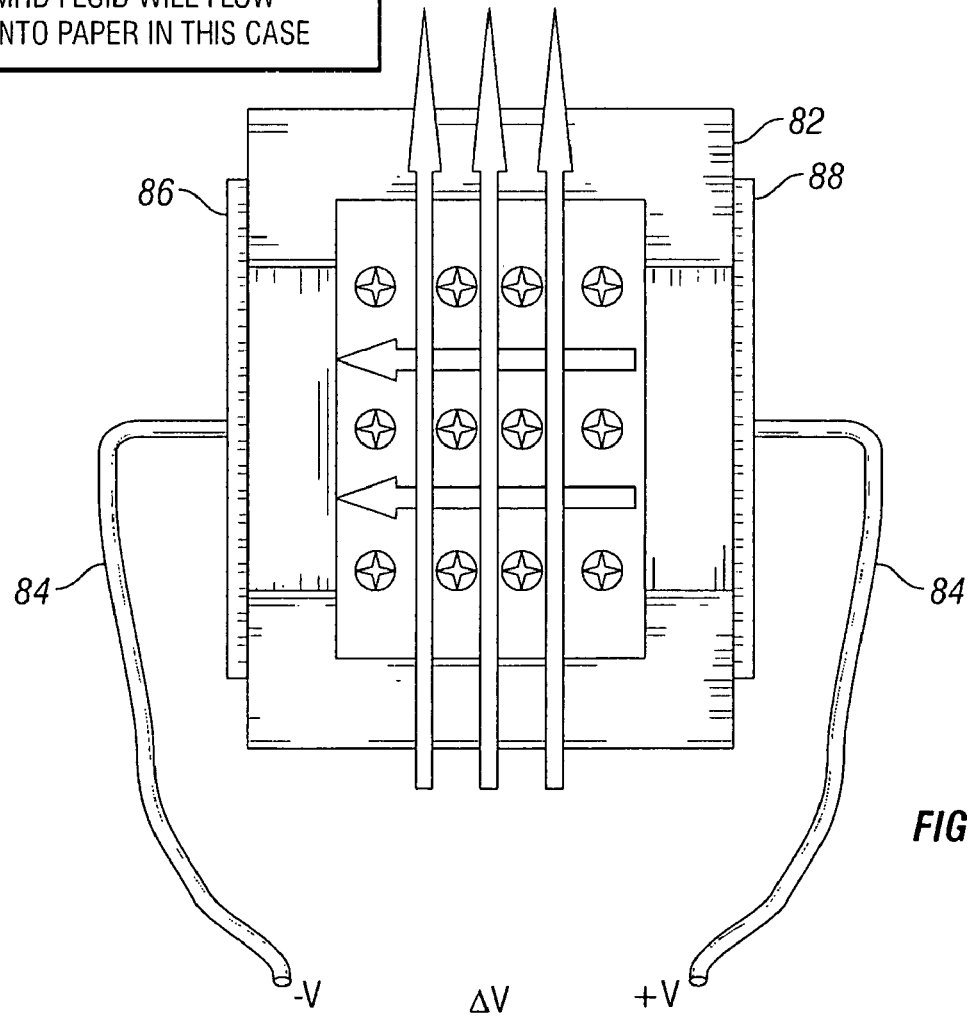

Now referring to FIG. 8, the wires 84 connected to each of the first electrical conductor 86 and the second electrical conductor 88 are used to create a voltage potential difference between the first electrical conductor 86 and the second electrical conductor 88. Those skilled in the art will note that such a voltage potential difference may be created by causing one of the first electrical conductor 86 and the second electrical conductor 88 to have a voltage higher than that of the other of the first electrical conductor 86 and the second electrical conductor 88. As shown in FIG. 8, the second electrical conductor 88 is caused to have a higher voltage than the first electrical conductor 86, thereby inducing electrical current flow from the second electrical conductor 88 to the first electrical conductor 86 (direction of induced electrical current flow indicated by the right-to-left arrows shown in FIG. 8).

Further, based on an arrangement of magnets within a multiple magnet array, a magnetic field is also induced across the electrically non-conductive segment 82 shown in FIG. 8. For example, in FIG. 8, a magnetic field is induced across the electrically non-conductive segment 82 in a direction indicated by the up-pointing arrows shown in FIG. 8. Accordingly, a direction of electrically conductive fluid flowing through the electrically non-conductive segment 82, and consequently, through the corresponding magneto-hydrodynamic pipe 62, is dependent on a direction of the induced electrical current and a direction of the magnetic field. As shown in FIG. 8, the direction of the induced electrical current and the direction of the magnetic field causes fluid to flow into a plane of the sheet showing FIG. 8.

Further, the rate of fluid flow in a magneto-hydrodynamic pipe 62 may be controlled by adjusting a value of the electrical current induced across the fluid in the corresponding electrically non-conductive segment 82 of the magneto-hydrodynamic pipe 62. Further still, the rate of fluid flow in a magneto-hydrodynamic pipe 62 may be controlled by adjusting a strength or orientation of the magnetic field induced across the fluid in the corresponding electrically non-conductive segment 82 of the magneto-hydrodynamic pipe 62.

Figure 9:
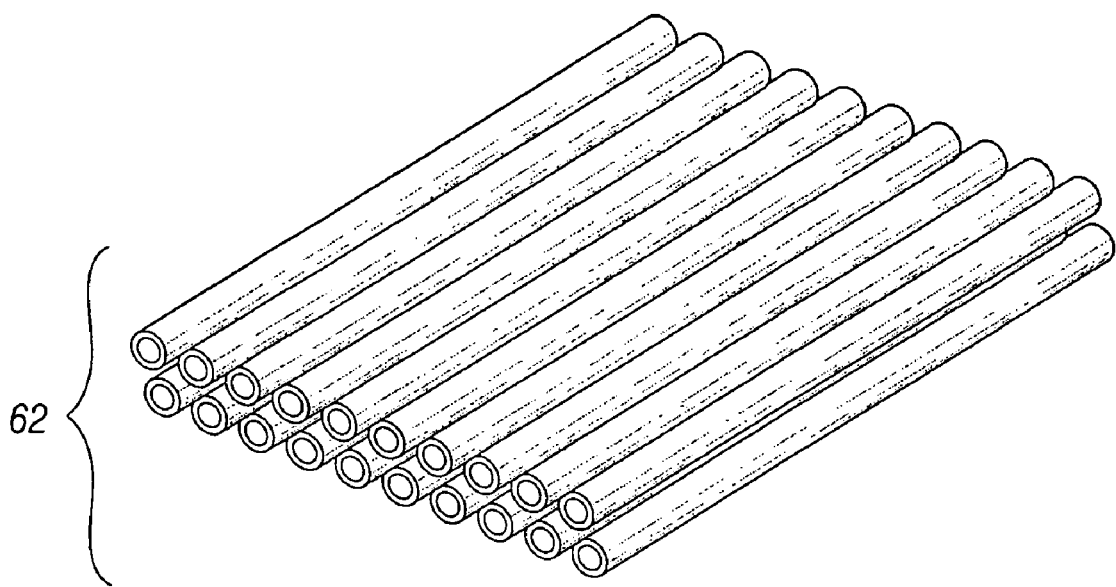
FIG. 9 shows a portion of a cooling apparatus in accordance with an embodiment of the present invention.

As described above, a multiple magnet array 60 may be used to direct fluid to and away from multiple integrated circuits. For each integrated circuit that may be cooled using the multiple magnet array 60, a set of magneto-hydrodynamic pipes 62 for carrying fluid toward the integrated circuit and a set of magneto-hydrodynamic pipes 62 for carrying fluid away from the integrated circuit are provided. An example of such sets of magneto-hydrodynamic pipes 62 is shown in FIG. 9.

Figure 10:
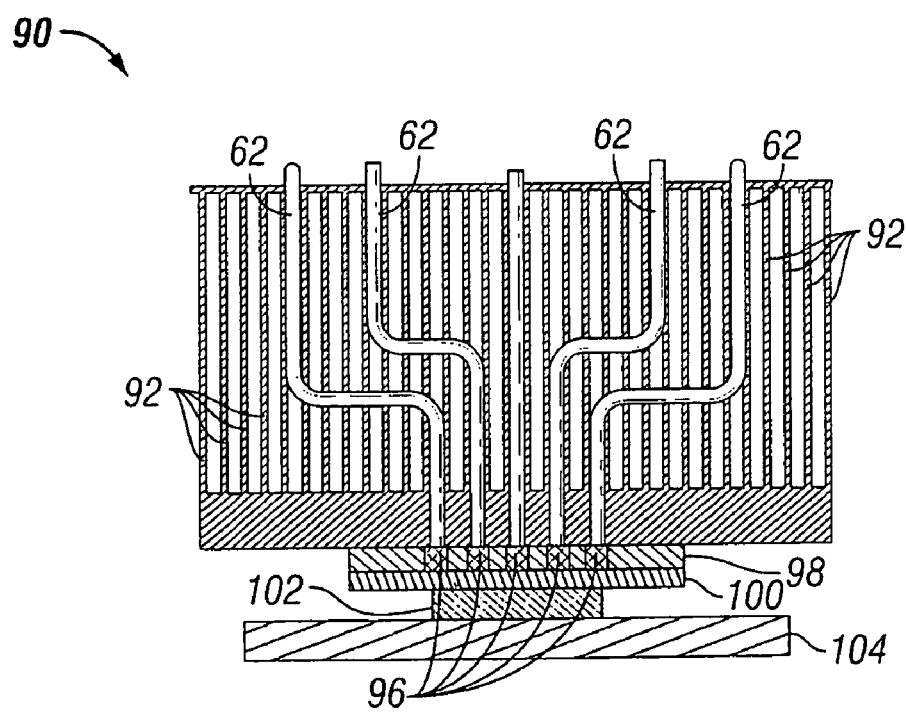
FIG. 10 shows a heat sink that may be used in accordance with an embodiment of the present invention.

The magneto-hydrodynamic pipes 62 operatively connected to the multiple magnet array 60 are each associated with a heat sink of an integrated circuit that may be cooled using the multiple magnet array 60. FIG. 10 shows an example of a heat sink 90 that may be used in accordance with an embodiment of the present invention. The heat sink 90 has a plurality of "fins" 92 allowing for and facilitating the dissipation of heat away from the heat sink 90. A plurality of magneto-hydrodynamic pipes 62 extend through the heat sink 90. Those skilled in the art will note that in one or more embodiments of the present invention, the magneto-hydrodynamic pipes 62 extending through the heat sink 90 may be integral with a body of the heat sink 90.

One end of each of the magneto-hydrodynamic pipes 62 is associated with a temperature sensor 96 embedded in a thermal interface material 98 disposed on a lid 100 positioned over an integrated circuit 102 and substrate 104. One another end of each of the magneto-hydrodynamic pipes 62 is operatively connected to a multiple magnet array 60 as described above.

Each temperature sensor 96 is configured to measure/sense a temperature at a particular location (or "hot spot) of the integrated circuit 102. Further, those skilled in the art will note that the sizing and arrangement of one or more of the temperature sensors 96, the thermal interface material 98, and the lid 100 may be adjusted so as to improve the accuracy of temperature measurements taken by one or more of the temperature sensors 96.

In one or more embodiments of the present invention, one or more of fins 92, magneto-hydrodynamic pipes 62, and lid 100 may be formed of a thermally conductive material. For example, one or more of fins 92, magneto-hydrodynamic pipes 62, and lid 100 may be formed of copper.

Further, in one or more embodiments of the present invention, a heat sink may have a different fin configuration than that shown in FIG. 10. Moreover, those skilled in the art will note that the heat sink 90 shown in FIG. 10 is not necessarily to scale and is not limited to a particular length, width, and/or height.

Further, although the heat sink 90 in FIG. 10 is shown as having a certain number of magneto-hydrodynamic pipes 62, in one or more other embodiments of the present invention, a different number of magneto-hydrodynamic pipes may be used.

As described above, a magneto-hydrodynamic pipe in a heat sink used with or as part of a cooling apparatus in accordance with one or more embodiments of the present invention has an end that is associated with a temperature sensor on a lid disposed over an integrated circuit. By using the temperature readings taken by the temperature sensor, a multiple magnet array of the cooling apparatus may be adjusted so as to effectuate a desired response with respect to cooling of a hot sport of a particular integrated circuit.

Figure 11:
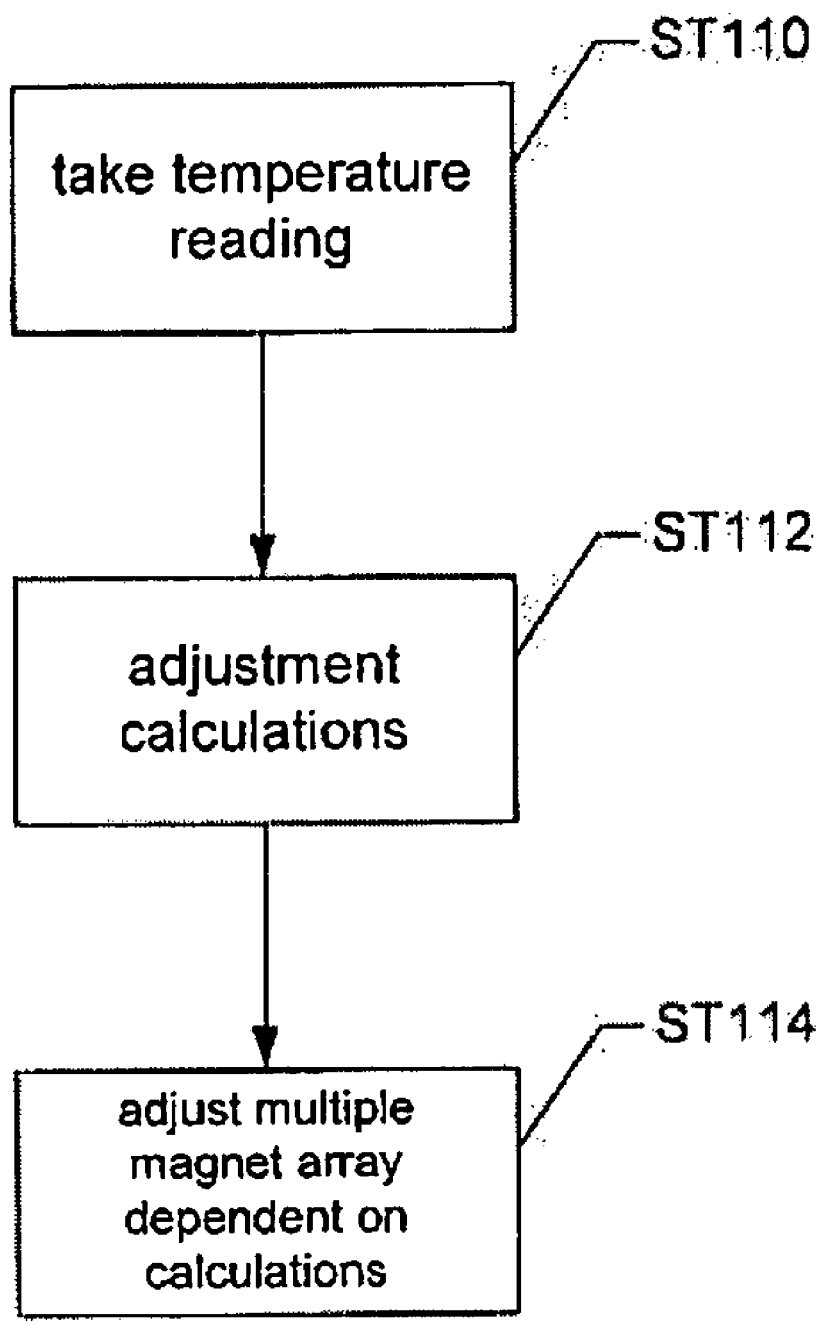
FIG. 11 shows a flow process in accordance with an embodiment of the present invention.

FIG. 11 shows an example of a flow process in accordance with an embodiment of the present invention. In FIG. 11, a temperature sensor is used to take a temperature reading at a location of an integrated circuit ST110. The temperature reading may be transmitted to, for example, a control module that calculates certain adjustments based on the temperature reading ST112. The adjustments may be made in reliance on assuming that ambient air flow conditions, cooling apparatus, and/or heat sink parameters remain constant. In such a manner, the parameters associated with a multiple magnet array of the heat sink may be adjusted without being dependent on varying ambient, heat sink, or cooling apparatus conditions.

In ST114, adjustments to the multiple magnet array of the heat sink are made based on the calculations in ST112. These adjustments may involve, for example, adjusting an electrical current induced across fluid in one or more segments in the multiple magnet array. In such a manner, the rate of fluid flow may be adjusted so as to more quickly or more slowly dissipate heat away from one or more hot spots.

Those skilled in the art will note that the control module may be any device or medium usable to make adjustment calculations. For example, the control module may be part of another integrated circuit or may be a software module executable by the integrated circuit being cooled. Further, in one or more embodiments of the present invention, a separate integrated circuit dedicated for controlling the parameters of the multiple magnet array be may implemented.

Advantages of the present invention may include one or more of the following. In one or more embodiments of the present invention, a cooling apparatus may be used to cool one or more integrated circuits disposed on a circuit board.

In one or more embodiments of the present invention, a flow of thermally conductive fluid used to cool one or more hot spots of an integrated circuit may be controlled so as to effectuate a desired level of cooling.

In one or more embodiments of the present invention, a multiple magnet array for driving the flow of fluid used to cool one or more hot spots of an integrated circuit resides separate from the integrated circuit.

In one or more embodiments of the present invention, a multiple magnet array may be used to have multiple channels cool across an area of an integrated circuit, where the multiple magnet array may also be used to more directly cool a hot spot of an integrated circuit.

In one or more embodiments of the present invention, a magnetic field used to drive the flow of fluid used to cool one or more hot spots of an integrated circuit may be shielded so as to prevent magnetic field interference.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
  a circuit board;
  a plurality of integrated circuits disposed on the circuit board;
  an array of magnets operatively disposed on the circuit board; and
  a plurality of pipes operatively connected between the plurality of integrated circuits and the array of magnets,
  wherein fluid flow in at least one of the plurality of pipes is dependent on at least one magnetic field generated by the array of magnets
  wherein the at least one magnetic field is generated across first and second segments of the at least one pair of the pipes,
  wherein the segments are formed of an electrically non-conductive material, and
  wherein a fluid flow direction in the first segment is opposite to that in the second segment.

2. The computer system of claim 1, further comprising:
  a heat exchanger disposed on the circuit board and operatively connected to the array of magnets.

3. The computer system of claim 1, further comprising:
  a ferromagnetic metal piece arranged to at least partially shield at least one magnetic field generated by the array of magnets.

4. The computer system of claim 1, further comprising
  a first electrical conductor attached to a portion of the segment; and
  a second electrical conductor attached to another portion of the segment,
  wherein fluid flow within the segment is dependent on an electrical current induced between the first electrical conductor and the second electrical conductor.

5. The computer system of claim 1, wherein the electrically non-conductive material is plastic.

6. The computer system of claim 1, wherein the fluid flow is dependent on an electrical current induced across a portion of the at least one of the plurality of pipes.

7. The computer system of claim 6, further comprising:
  a temperature sensor arranged to measure a temperature at a location of one of the plurality of integrated circuits, wherein the induced electrical current is dependent on the temperature sensor.

8. The computer system of claim 1, wherein fluid flow in each of the plurality of pipes is individually controllable.

9. The computer system of claim 1, wherein the fluid is at least one of thermally and electrically conductive.

10. The computer system of claim 1, wherein at least one of the plurality of pipes is arranged to carry fluid away from at least one of the integrated circuits dependent on the array of magnets, and wherein at least one other of the plurality of pipes is arranged to carry fluid toward the at least one of the integrated circuits dependent on the array of magnets.

11. A method of cooling a plurality of integrated circuits, comprising:
  generating a plurality of magnetic fields using an array of magnets;
  using a plurality of pipes to pass electrically and thermally conductive fluid across the plurality of magnetic fields; and
  propagating the fluid using the plurality of pipes toward the plurality of integrated circuits dependent on the plurality of magnetic fields
  wherein the at least one magnetic field is generated across first and second segments of the at least one pair of the pipes,
  wherein the segments are formed of an electrically non-conductive material, and
  wherein a fluid flow direction in the first segment is opposite to that in the second segment.

12. The method of claim 11, further comprising: at least partially shielding the plurality of magnetic fields.

13. The method of claim 11, further comprising: measuring a temperature at a location of one of the plurality of integrated circuits; and adjusting the propagating dependent on the measuring.

14. The method of claim 11, further comprising:
  inducing electrical currents across the plurality of magnetic fields, wherein the propagating is dependent on the electrical currents.

15. A cooling apparatus, comprising:
  a plurality of magnets housed in a ferromagnetic metal piece;
  a plurality of pipes operatively connected to the ferromagnetic metal piece,
  wherein the plurality of pipes are operatively connected to a plurality of integrated circuits;
  a heat exchanger arranged to dissipate heat from fluid carried in the plurality of pipes,
  wherein flow of the fluid in the plurality of pipes is dependent on a plurality of magnetic fields generated by the plurality of magnets
  wherein the at least one magnetic field is generated across first and second segments of the at least one pair of the pipes,
  wherein the segments are formed of an electrically non-conductive material, and
  wherein a fluid flow direction in the first segment is opposite to that in the second segment.

16. The cooling apparatus of claim 15, wherein the flow of fluid is dependent on an electrical current induced across one of the plurality of magnetic fields.

17. The cooling apparatus of claim 15, wherein the ferromagnetic metal piece is arranged to at least partially shield the plurality of magnetic fields.

18. The cooling apparatus of claim 15, wherein the flow of fluid is dependent on a temperature at a location of at least one of the plurality of integrated circuits.

19. The cooling apparatus of claim 15, wherein the flow of fluid in each of the plurality of pipes is individually controllable.

* * * * *